United States Patent
Stern et al.

(10) Patent No.: US 10,254,371 B2
(45) Date of Patent: Apr. 9, 2019

(54) SYSTEM AND METHOD FOR Z-SHIM COMPENSATED ECHO-PLANAR MAGNETIC RESONANCE IMAGING

(71) Applicant: BRIGHAM AND WOMEN'S HOSPITAL, INC., Boston, MA (US)

(72) Inventors: Emily Stern, Chestnut Hill, MA (US); David Silbersweig, Chestnut Hill, MA (US); Hong Pan, Boston, MA (US); Yihong Yang, Baltimore, MD (US); Hong Gu, Baltimore, MD (US)

(73) Assignee: Brigham and Women's Hospital, Inc., Boston, MA (US)

( * ) Notice: Subject to any disclaimer, the term of this patent is extended or adjusted under 35 U.S.C. 154(b) by 362 days.

(21) Appl. No.: 14/915,556

(22) PCT Filed: Aug. 28, 2014

(86) PCT No.: PCT/US2014/053051
§ 371 (c)(1),
(2) Date: Feb. 29, 2016

(87) PCT Pub. No.: WO2015/031560
PCT Pub. Date: Mar. 5, 2015

(65) Prior Publication Data
US 2016/0209487 A1    Jul. 21, 2016

Related U.S. Application Data

(60) Provisional application No. 61/871,103, filed on Aug. 28, 2013.

(51) Int. Cl.
*G01R 33/565* (2006.01)
*G01R 33/48* (2006.01)
(Continued)

(52) U.S. Cl.
CPC ... *G01R 33/56536* (2013.01); *G01R 33/4806* (2013.01); *G01R 33/5616* (2013.01); *G01R 33/4835* (2013.01)

(58) Field of Classification Search
CPC ............ G01R 33/4806; G01R 33/4835; G01R 33/5616; G01R 33/56536; G01R 33/561;
(Continued)

(56) References Cited

U.S. PATENT DOCUMENTS 6,472,872 B1    10/2002 Jack, Jr. et al.
6,496,560 B1 *  12/2002 Lin ..................... A61B 6/032
                                                  378/62

(Continued)

OTHER PUBLICATIONS

Constable, et al., Composite Image Formation in z-Shimmed Functional MR Imaging, Magnetic Resonance in Medicine, 1999, 42:110-117.
(Continued)

*Primary Examiner* — Jermele M Hollington
*Assistant Examiner* — Suresh K Rajaputra
(74) *Attorney, Agent, or Firm* — Quarles & Brady LLP (57) ABSTRACT

A system and method for imaging a subject includes a first imaging pulse sequence having gradient blips along an x-direction and a y-direction to acquire calibration image data from multiple slices. The imaging pulse sequence also includes a plurality of Z-shimming gradient blips coincident in time with the gradient blips along the x- and y-directions and varied within each slice. A plurality of calibration images are reconstructed from the calibration image data and a comparison image is formed by selecting an image from the calibration images corresponding to at least one of the varied Z-shimming gradient blips for each slice to determine a desired value of the Z-shimming gradient blips. The desired values are used to perform a second pulse sequence to acquire clinical image data from the subject.

(Continued)

The second pulse sequence is used to acquire clinical images having been compensated for magnetic susceptibility variations within the subject.

20 Claims, 6 Drawing Sheets

(51) Int. Cl.
*G01R 33/561* (2006.01)
*G01R 33/483* (2006.01)

(58) Field of Classification Search
CPC ...... G01R 33/56; G01R 33/565; G01R 33/54; G01R 33/4833
See application file for complete search history.

(56) References Cited

U.S. PATENT DOCUMENTS

| | | | |
|---|---|---|---|
| 6,618,607 | B2 | 9/2003 | Song |
| 7,907,767 | B2 | 3/2011 | Bekku et al. |
| 2004/0254449 | A1* | 12/2004 | Roopchansingh ......... G01R 33/56563 600/410 |
| 2006/0033492 | A1* | 2/2006 | Van Den Brink ......... G01R 33/5615 324/307 |

OTHER PUBLICATIONS

Deng, et al., Simultaneous Z-Shim Method for Reducing Susceptibility Artifacts With Multiple Transmitters, Magnetic Resonance in Medicine, 2009, 61:255-259.

Du, et al., Reducing Susceptibility Artifacts in fMRI Using Volume-Selective z-Shim Compensation, Magnetic Resonance in Medicine, 2007, 57:396-404.

Frahm, et al., Direct FLASH MR Imaging of Magnetic Field Inhomogeneities by Gradient Compensation, Magnetic Resonance in Medicine, 1988, 6:474-480.

Gu, et al., Single-Shot Interleaved Z-Shim EPI with Optimized Compensation for Signal Losses Due to Susceptibility-Induced Field Inhomogeneity at 3 T, NeuroImage, 2002, 17:1358-1364.

Heberlein, et al., Simultaneous Acquisition of Gradient-Echo and Asymmetric Spin-Echo for Single-Shot Z-Shim: Z-SAGA, Magnetic Resonance in Medicine, 2004, 51:212-216.

Hoge, et al., Efficient Single-Shot Z-Shim EPI Via Spatial and Temporal Encoding, In Proc. of IEEE Intl. Symposium on Biomedical Imaging (ISBI), 2011, pp. 1565-1568.

Hoge, et al., A Method for Z-Shim Compensated EPI-Bold Imaging in a Single Shot, In Proc. of 2013 IEEE Intl. Symp. on Biomedical Imaging (ISBI 2013), pp. 338-341.

Song, Single-Shot EPI With Signal Recovery From the Susceptibility-Induced Losses, Magnetic Resonance in Medicine, 2001, 46:407-411.

Truong, et al., Single-Shot Dual-Z-Shimmed Sensitivity-Encoded Spiral-In/Out Imaging for Functional MRI With Reduced Susceptibility Artifacts, Magnetic Resonance in Medicine, 2008, 59:221-227.

Van Gelderen, et al., Three-Dimensional Functional Magnetic Resonance Imaging of Human Brain on a Clinical 1.5-T Scanner, Proc. Natl. Acad. Sci. USA, 1995, 92:6906-6910.

Yang, et al., Reduction of Magnetic Field Inhomogeneity Artifacts in Echo Planar Imaging with SENSE and GESEPI at High Field, Magnetic Resonance in Medicine, 2004, 52:1418-1423.

Yang, et al., Simultaneous Perfusion and Blood-Oxygenation-Level-Dependent Measurements Using Single-Shot Interleaved Z-Shim Echo-Planar Imaging, Magnetic Resonance in Medicine, 2005, 53:1207-1211.

PCT International Search Report and Written Opinion, PCT/US2014/053051, dated Dec. 18, 2014.

Qing-San Xiang et al., Correction for Geometric Distortion and N/2 Ghosting in EPI by Phase Labeling for Additional Coordinate Encoding (PLACE). 57 Magnetic Resonance in Medicine 731 (2007).†

Gary Glover, 3D z-Shim Method for Reduction of Susceptibility Effects in BOLD fMRI. 42 Magnetic Resonance in Medicine 290 (1999).†

\* cited by examiner
† cited by third party

SYSTEM AND METHOD FOR Z-SHIM COMPENSATED ECHO-PLANAR MAGNETIC RESONANCE IMAGING

CROSS-REFERENCE TO RELATED APPLICATIONS

This application represents the national stage entry of PCT International Application No. PCT/US2014/053051 filed Aug. 28, 2014, which claims priority to U.S. Provisional Application Ser. No. 61/871,103, filed Aug. 28, 2013, both of which are incorporated herein by reference for all purposes.

BACKGROUND OF THE INVENTION

The present disclosure relates to medical imaging. More particularly, the disclosure relates to Z-shim compensation for magnetic resonance imaging (MRI).

When a substance such as human tissue is subjected to a uniform magnetic field (polarizing field $B_0$) applied along, for example, a Z axis of a Cartesian coordinate system, the individual magnetic moments of the spins in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, Mz, may be rotated, or "tipped," into the x-y plane to produce a net transverse magnetic moment $M_t$. A NMR signal is emitted by the excited spins after the excitation signal $B_1$ is terminated, this signal may be received and processed to form an image or produce a spectrum.

The MR signals acquired with an MRI system are signal samples of the subject of the examination in Fourier space, or what is often referred to in the art as "k-space." Typically, a region to be imaged is scanned by a sequence of measurement cycles in which gradients vary according to the particular localization method being used. Each MR measurement cycle, or pulse sequence, typically samples a portion of k-space along a sampling trajectory characteristic of that pulse sequence. This is accomplished by employing magnetic fields ($G_x$, $G_y$, and $G_z$) that have the same direction as the polarizing field $B_0$, but which have a gradient along the respective x, y, and z axes. By controlling the strength of these gradients during each NMR cycle, the spatial distribution of spin excitation can be controlled and the location of the resulting NMR signals can be identified. The acquisition of the NMR signals samples is referred to as sampling k-space, and a scan is completed when enough NMR cycles are performed to adequately sample k-space. The resulting set of received NMR signals are digitized and processed to reconstruct the image using one of many well known reconstruction techniques.

Functional magnetic resonance imaging (fMRI) provides an approach to study neuronal activity. Conventional fMRI detects changes in cerebral blood volume, flow, and oxygenation that locally occur in association with increased neuronal activity that is induced by functional paradigms. This physiological response is often referred to as the "hemodynamic response." The hemodynamic response to neuronal activity provides a mechanism for image contrast commonly referred to as the blood-oxygen level dependent (BOLD) signal contrast. An MRI system can be used to acquire signals from the brain over a period of time. As the brain performs a task, these signals are modulated synchronously with task performance to reveal which regions of the brain are involved in performing the task. The series of fMRI time course images must be acquired at a rate that is high enough to see the changes in brain activity induced by the functional paradigm. In addition, because neuronal activity may occur at widely dispersed locations in the brain, a relatively large 3D volume or multi-slice volume must be acquired in each time frame.

Unfortunately, fMRI imaging of the brain acquired using gradient-echo echo-planar imaging (GE-EPI) consistently suffers adverse effects from magnetic field inhomogeneity in regions close to nasal sinuses and ear canals. The presence of both air and tissue causes magnetic susceptibility variation at the boundary of the two regions, resulting in both geometric distortion and signal loss. Signal loss occurs due to phase accumulation, which pushes the signal outside the slice encoding region. This signal can be recovered back into the imaging plane via Z-shim methods, where a Z gradient is applied across the slice prior to data acquisition. This is commonly implemented as a two-shot protocol, where each final image is formed through a combination of two Z-shimmed images, each emphasizing signal regions that are "dark" in the complementary image. However, doing so necessarily reduces the temporal resolution by half.

Single-shot Z-shim methods are attractive because data can be acquired for both components of the final image after a single RF excitation pulse. However, these methods commonly require longer EPI echo-trains, which can increase susceptibility effects resulting in increased geometric distortion.

It would be desirable to have a system and method for controlling or compensating for magnetic susceptibility variations within a subject to be imaged using an MRI system, such as during an fMRI study.

SUMMARY OF THE INVENTION

The present disclosure overcomes the aforementioned drawbacks by providing a system and method for compensating for magnetic susceptibility variations within a subject to be imaged.

It is an aspect of the invention to provide a method is disclosed for compensating for magnetic susceptibility variations within a subject to be imaged using a magnetic resonance imaging (MRI) system. The method includes performing, with the MRI system, a first pulse sequence to select desired shimming parameters. The pulse sequence includes an imaging pulse sequence including gradient blips along two orthogonal gradient directions to acquire calibration image data from a plurality of slices across the subject and a plurality of shimming gradient blips applied along a third gradient direction orthogonal to the two orthogonal gradient directions, wherein the shimming gradient blips are coincident in time with the gradient blips along two orthogonal gradient directions and are varied within each of the plurality of slices. The method also includes reconstructing a plurality of calibration images from the calibration image data and forming a comparison image by selecting an image from plurality of calibration images corresponding to at least one of the varied shimming gradient blips for each slice and combining the selected images into the comparison image. The method also includes comparing the plurality of calibration images to the comparison image to determine a value of the shimming gradient blips to be included in the desired shimming parameters and performing, with the MRI system, a second pulse sequence using the value of the shimming gradient blips included in the desired shimming parameters to acquire clinical image data from the subject. The method further includes reconstructing the clinical image data to form a first set of clinical images of the subject and selectively combining the clinical images to form a plurality of clinical composite images of the subject.

It is another aspect of the invention to provide a magnetic resonance imaging (MRI) system is disclosed that includes a magnet system configured to generate a polarizing magnetic field about at least a portion of a subject arranged in the MRI system and a magnetic gradient system including a plurality of magnetic gradient coils configured to apply at least one magnetic gradient field to the polarizing magnetic field. The MRI system also includes a radio frequency (RF) system configured to apply an RF field to the subject and to receive magnetic resonance signals therefrom and a computer system programmed to control the gradient system and RF system to perform a first pulse sequence to select desired z-shimming parameters. The pulse sequence includes an imaging pulse sequence including gradient blips along an x-direction and a y-direction to acquire calibration image data from a plurality of slices across the subject and a plurality of z-shimming gradient blips along z-direction, wherein the z-shimming gradient blips are coincident in time with the gradient blips along the x-direction and the y-direction and are varied within each of the plurality of slices. The computer system is further configured to reconstruct a plurality of calibration images form the calibration image data, select a comparison image, and compare the plurality of calibration images to the comparison image to determine a value of the z-shimming gradient blips that provided calibration images approximate to the comparison image. The computer system is further configured to control the gradient system and RF system to perform a second pulse sequence using the value of the z-shimming gradient blips included in the desired z-shimming parameters to acquire clinical image data from the subject. The computer system is further configured to reconstruct the clinical image data to form a first set of clinical images of the subject and selectively combine the clinical images to form a plurality of clinical composite images of the subject by combining consecutive images acquired with a given z-shimming gradient doublet indicated by the desired z-shimming parameters.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
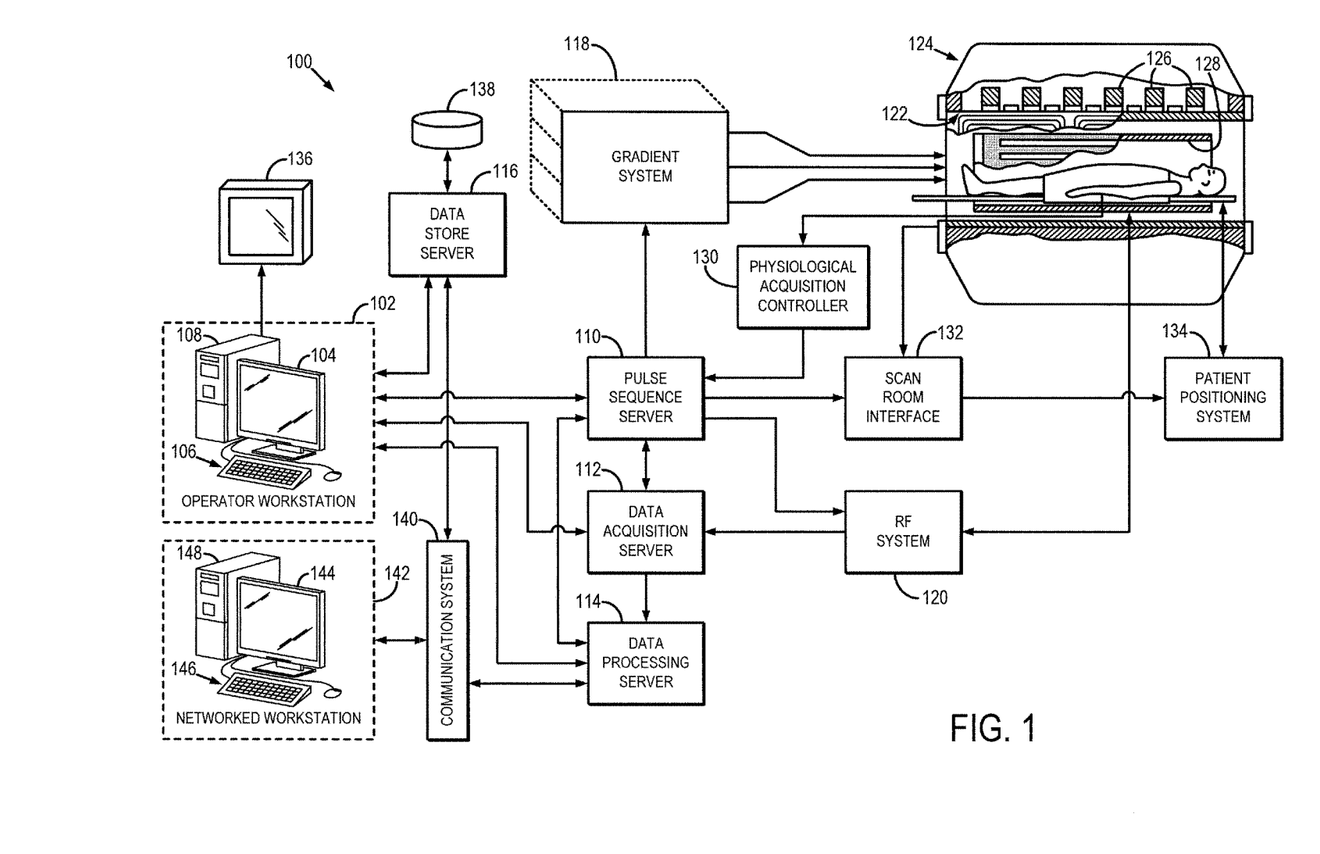
FIG. 1 is a block diagram of an example of a magnetic resonance imaging (MRI) system configured to employ the present invention.

Referring particularly to FIG. 1, an example of a magnetic resonance imaging (MRI) system 100 is illustrated. The MRI system 100 includes a workstation 102 having a display 104 and a keyboard 106. The workstation 102 includes a processor 108 that is commercially available to run a commercially-available operating system. The workstation 102 provides the operator interface that enables scan prescriptions to be entered into the MRI system 100. The workstation 102 is coupled to four servers: a pulse sequence server 110; a data acquisition server 112; a data processing server 114; and a data store server 116. The workstation 102 and each server 110, 112, 114, and 116 are connected to communicate with each other.

The pulse sequence server 110 functions in response to instructions downloaded from the workstation 102 to operate a gradient system 118 and a radiofrequency (RF) system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128 (or a head (and neck) RF coil for brain imaging).

RF excitation waveforms are applied to the RF coil 128, or a separate local coil, such as a head coil, by the RF system 120 to perform the prescribed magnetic resonance pulse sequence. Responsive MR signals detected by the RF coil 128, or a separate local coil, are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays.

The RF system 120 also includes one or more RF receiver channels. Each RF receiver channel includes an RF preamplifier that amplifies the MR signal received by the coil 128 to which it is connected, and a detector that detects and digitizes the quadrature components of the received MR signal. The magnitude of the received MR signal may thus be determined at any sampled point by the square root of the sum of the squares of the I and Q components:

$$M = \sqrt{I^2 + Q^2} \tag{1}$$

and the phase of the received MR signal may also be determined:

$$\varphi = \tan^{-1}\left(\frac{Q}{I}\right). \tag{2}$$

The pulse sequence server 110 also optionally receives patient data from a physiological acquisition controller 130. The controller 130 receives signals from a number of different sensors connected to the patient, such as electrocardiograph (ECG) signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network or communication system 140 to other facilities that may include other networked workstations 142.

The communications system 140 and networked workstation 142 may represent any of the variety of local and remote computer systems that may be included within a given clinical or research facility including the system 100 or other, remote location that can communicate with the system 100. In this regard, the networked workstation 142 may be functionally and capably similar or equivalent to the operator workstation 102, despite being located remotely and communicating over the communication system 140. As such, the networked workstation 142 may have a display 144 and a keyboard 146. The networked workstation 142 includes a processor 148 that is commercially available to run a commercially-available operating system. The networked workstation 142 may be able to provide the operator interface that enables scan prescriptions to be entered into the MRI system 100.

Figure 2:
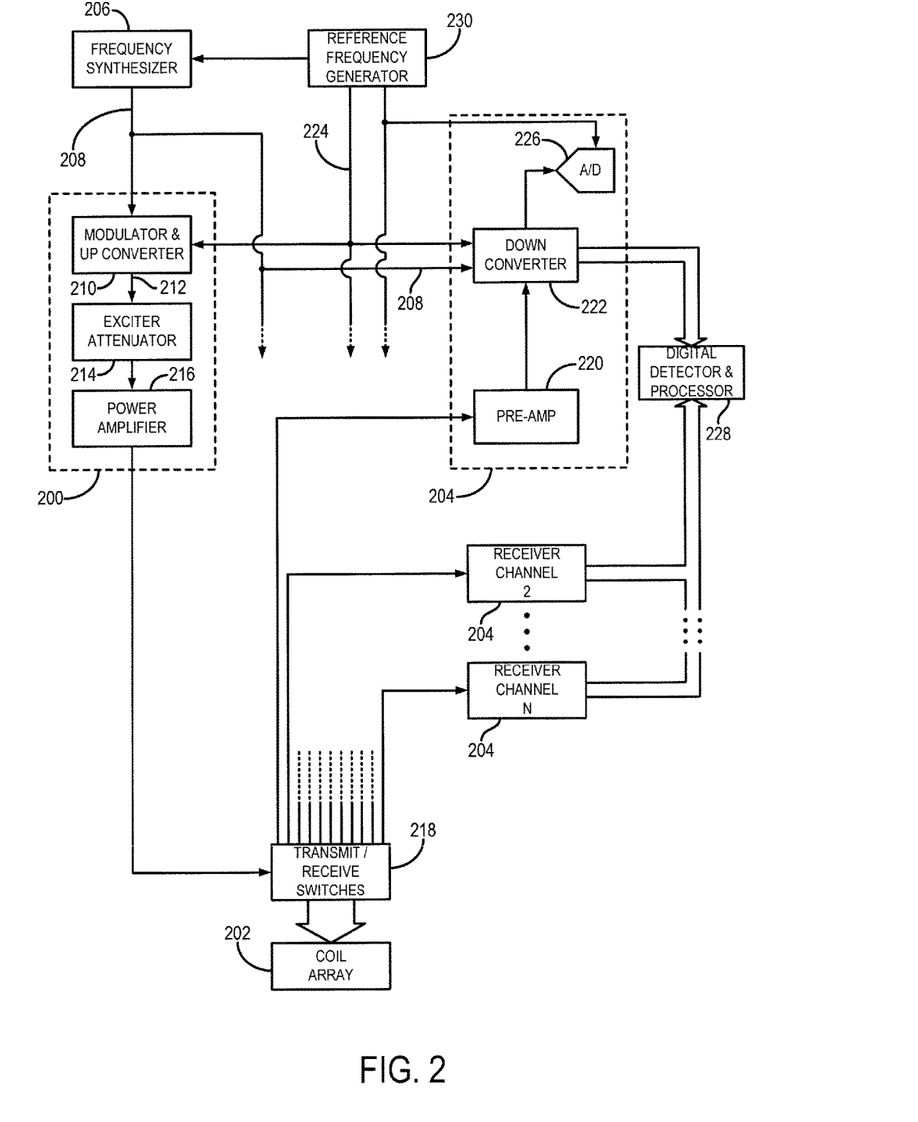
FIG. 2 is a block diagram of a radio frequency (RF) system of an MRI system, such as may be included in the system of FIG. 1.

As shown in FIG. 1, the RF system 120 may be connected to the whole body RF coil 128, or as shown in FIG. 2, a transmitter section of the RF system may connect to at least one transmit channel 200 of a coil array 202, and its receiver section may connect to at least one receiver channel 204 of the coil array 202. Often, the transmitter section is connected to the whole body RF coil or a local transmit coil, and, in so-called "parallel receiver" coil arrays, each receiver section is connected to a separate receiver channel 204.

Referring particularly to FIG. 2, the RF system 126 includes a transmitter that produces a prescribed RF excitation field. The base, or carrier, frequency of this RF excitation field is produced under control of a frequency synthesizer 206 that receives a set of digital signals from the pulse sequence server 118. These digital signals indicate the frequency and phase of the RF carrier signal produced at an output 208. The RF carrier is applied to a modulator and up converter 210 where its amplitude is modulated in response to a signal, R(t), also received from the pulse sequence server 118. The signal, R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 212 is attenuated by an exciter attenuator circuit 214 that receives a digital command from the pulse sequence server 118. The attenuated RF excitation pulses are applied to a power amplifier 216, which drives the RF coil array 202 through a transmit/receive (T/R) switch 218.

Referring still to FIG. 2, the signal produced by the subject is picked up by the coil array 202 and applied to the inputs of a set of receiver channels 204. A pre-amplifier 220 in each receiver channel 204 amplifies the signal by an amount determined by a digital attenuation signal received from the pulse sequence server 118. The received signal is at or around the Larmor frequency, and this high frequency signal is down-converted in a two step process by a down converter 222, which first mixes the detected signal with the carrier signal on line 208 and then mixes the resulting difference signal with a reference signal on line 224. The down converted MR signal is applied to the input of an analog-to-digital (A/D) converter 226 that samples and digitizes the analog signal and applies it to a digital detector and signal processor 228 that produces 16-bit in-phase (I) values and 16-bit quadrature (Q) values corresponding to the received signal. The resulting stream of digitized I and Q values of the received signal are output to the data acquisition server 120. The reference signal, as well as the sampling signal applied to the A/D converter 226, are produced by a reference frequency generator 230.

Figure 3:
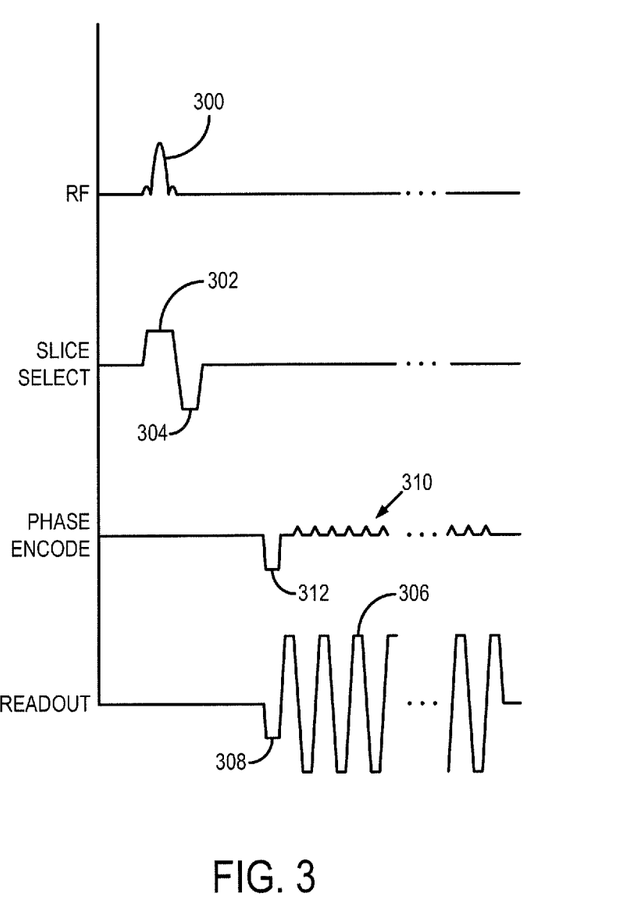
FIG. 3 is a graphic illustration of an exemplary echo planar imaging (EP) pulse sequence for directing the MRI system of FIG. 1.

An exemplary pulse sequence employed to direct the MRI system to acquire image data is illustrated in FIG. 3. Such an exemplary pulse sequence is a gradient-recalled echo planar imaging (GE-EPI) pulse sequence. The pulse sequence includes a spatially selective RF excitation pulse 300 that is played out in the presence of a slice-selective gradient 302 in order to produce transverse magnetization in a plurality of prescribed imaging slices. The RF excitation pulse is the summation of RF excitation pulses that would be used to separately excite the desired plurality of slice locations and is applied with a flip angle. The slice-selective gradient 302 includes a rephasing lobe 304 that acts to rephase unwanted phase dispersions introduced by the slice-selective gradient 302 such that signal losses resultant from these phase dispersions are mitigated.

Following excitation of the nuclear spins in the prescribed imaging slices, image data is acquired by sampling a series of gradient-recalled echo signals in the presence of an alternating readout gradient 306. The alternating readout gradient may be preceded by the application of a pre-winding gradient 308 that acts to move the first sampling point along the frequency-encoding, or readout, direction by a distance $\Delta k_x$ in k-space. Spatial encoding of the echo signals along a phase-encoding direction may be performed by a series of phase encoding gradient "blips" 310, which are each played out in between the successive signals readouts such that each echo signal is separately phase encoded. The phase encoding gradient blips 310 are preceded by the application of a pre-winding gradient 312 that acts to move the first sampling point along the phase-encoding direction a distance $\Delta k_y$ in k-space. Together, the pre-winding gradients 308 and 312 serve to begin the sampling of k-space at a defined k-space location $(k_x, k_y)$.

As is known in the art, the foregoing pulse sequence is repeated a plurality of times with a different slice-selective gradient 302 being applied in each repetition such that multiple sets of a plurality of slice locations are sampled. In particular, each repetition is typically coupled with the coordination of functional tasks or stimulus designed to elicit the aforementioned hemodynamic responses that give rise to the BOLD contrast mechanism.

EPI techniques inherently suffer from several drawbacks. First, the required fast gradient switching for quick traversal through k-space are often mismatched, producing inconsistency in between data acquired on positive versus negative readout gradients. This mismatch produces Nyquist ghosting, where a faint copy of the imaged object appears shifted by one half of the field-of-view along the phase encoding direction.

Second, there is signal loss due to spin dephasing in regions of high magnetic susceptibility. As a result of variations in magnetic field strength that occur near the interfaces of substances of differing magnetic susceptibility, areas of air-bone-brain interface are vulnerable to so-called susceptibility artifacts with signal void and local image distortions, especially in GE-EPI for fMRI. This is particularly problematic for the study of neuropsychiatric conditions, where frontal and inferior temporal regions of great interest (such as ventral medial prefrontal cortex, medial orbitofrontal cortex, and amygdala) often lie within these areas.

An approach to control Nyquist ghosts involves temporal domain encoding (phase labeling for additional coordinate encoding, or PLACE) and spatial domain encoding (phased array ghost elimination, or PAGE). Temporal encoding modulates the echo planar imaging acquisition trajectory from frame to frame, enabling one to interleave data to remove inconsistencies that occur between sampling on positive and negative gradient readouts. With PLACE, one can coherently combine the interleaved data to cancel residual Nyquist ghosts. If the level of ghosting varies significantly from image to image, however, the signal cancellation that occurs with PLACE can adversely affect SNR, and thus integrating PLACE into a PAGE-based reconstruction process to yield significantly better Nyquist ghost correction that is more robust than PLACE or PAGE alone.

To address signal loss caused by magnetic susceptibility, Z-shim methods may be used to correct for signal loss by applying small $k_z$ gradients prior to the EPI read-out echo train. The gradient has the effect of "pre-phasing" the spins in the region of magnetic susceptibility so that they are in phase at the time of data acquisition. However, since $k_z$ compensation affects all spins in the slice, two complementary images must be generated to effectively recover signal loss in the areas away from the region of magnetic susceptibility variation.

Such variants of Z-shimming techniques rely on two key components to obtain susceptibility-compensated 4-dimensional (4D) fMRI time-series. First, an optimal Z-shimming parameter configuration algorithm is performed before each acquisition. Second, an optimal composite image reconstruction algorithm is implemented after each scan.

Methods for acquiring Z-shim compensated images in EPI-BOLD have been proposed by implementing "two shot" approaches, whereby the two complementary images are acquired independently. However, these approaches reduce the effective temporal resolution in half. For those implementing "single shot" methods, either by using either spiral-in/spiral-out or double-echo, the acquisition-window/echo-train is excessively long or the acquisition suffers from a loss in temporal resolution if the spins are refocused prior to the second echo.

In order to keep the echo train as short as possible and minimize the effective echo spacing and geometric distortion, an improved method may be implemented by acquiring complementary Z-shim images in an interleaved fashion using parallel imaging methods. This method includes multiple advantageous features over the standard EPI-BOLD pulse sequence, as described below.

First, a mechanism for alternating the readout gradient polarity may be implemented, to allow for interleaving two frames of data to eliminate Nyquist ghosts using, for example, PLACE or ghost elimination via spatial and temporal encoding GESTE. The ghost-free data may be used to calibrate parallel imaging reconstruction coefficients as in GESTE. Furthermore, parallel imaging, such as generalized auto-calibrating partially parallel acquisitions (GRAPPA), may be employed with, for example, a $2k_y$-by-$5k_x$ kernel.

Figure 4:
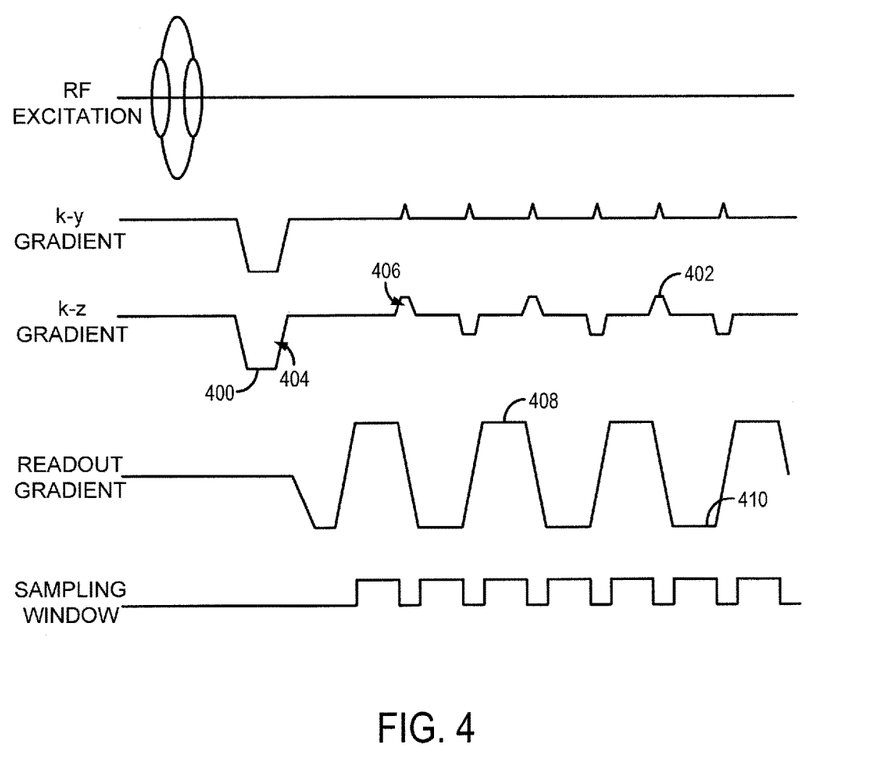
FIG. 4 is a graphic illustration of an exemplary EPI pulse sequence for directing the MRI system of FIG. 1 in accordance with the present disclosure.

Second, single-shot Z-shimming may be achieved by adding compensation gradients simultaneous in time with $k_y$ EPI blips, as illustrated in FIG. 4. In this regard, the shimming gradient blips are coincident in time with the gradient blips along two orthogonal gradient directions ($k_x$ and $k_y$) and are varied within each of the plurality of slices. For example, an initial gradient 400 is added prior to the EPI echo train, which only slightly increases the echo time, while concurrent $k_z$ blips 402 follow $k_y$ EPI blips. The time integrals of the compensation gradients, namely $A_1$ 404 and $A_2$ 406, are used to adjust the amount of shifts along $k_z$.

This method captures interleaved sets of Z-shimmed k-space data, wherein the k-space data with different Z-shim gradient values are acquired on alternate lines of separate $k_z$ frames. The first Z-shim value may be played out on the gradient between the navigator lines and the echo train, while the $k_z$ blip gradient then plays out the difference between two Z-shim settings. To accommodate the large distance along $k_z$ needed to achieve single-shot Z-shim compensation, the echo spacing between the positive read-out (+RO) 408 and negative read-out (−RO) 410 gradients may also be extended. Also, sampling may be extended to include the $k_z$ ramps to reduce the negative effects of this change, at the cost of slightly displacing the desired $\{k_y, k_z\}$ sampling point. However, this adjustment reduces the needed echo spacing change, which minimizes the geometric distortion effects. Furthermore, the high-spatial frequency sampling locations are typically filtered out prior to the statistical analysis, with sampling on the $k_z$ ramp thus leading to few adverse effects.

As described, the present invention provides two components that work hand-in-hand as a whole in a mini-pipeline of optimized scanning strategy/protocol/procedure. As will be described, the present invention can be used to deliver statically susceptibility-compensated, 3-D consecutive T2* BOLD GE-EPI image volumes and also slice-timing corrected, k-space spatial noise-suppressed and temporal-property preserved 4-D time series of such 3-D volumes. To achieve this balance, the two sub-processes are provided. A first sub-process facilitates selection of desirable and/or optimal Z-shimming parameter configuration that is implemented before each scan. A second sub-process facilitates creation of a desirable or optimal composite image reconstruction implemented after each scan.

Figure 5:
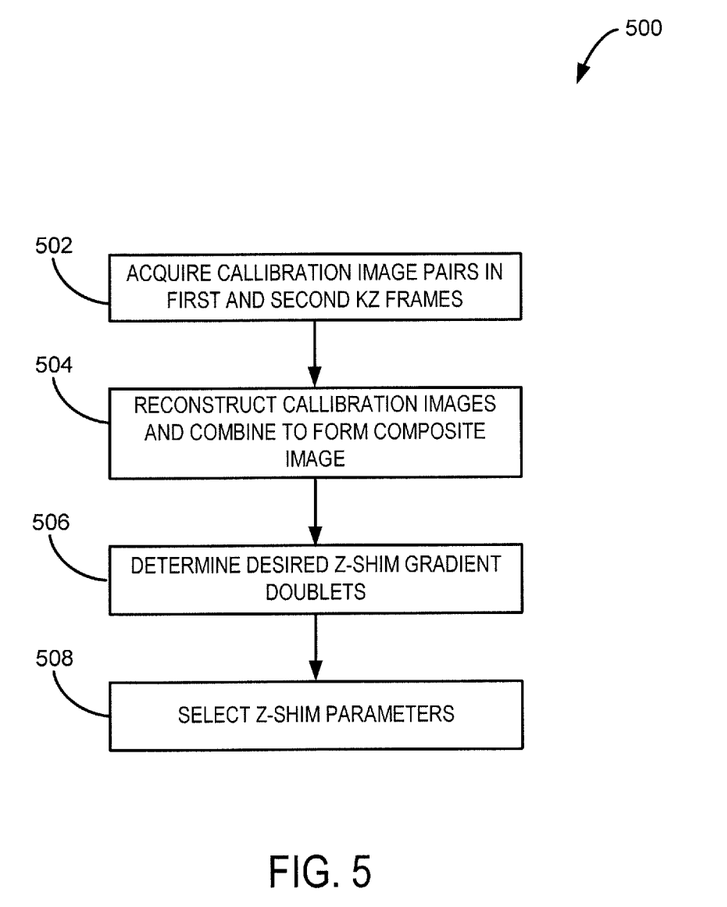
FIG. 5 is a flow chart setting forth the steps of a method for calibrating a shimming process in accordance with the present disclosure using an MRI system such as illustrated in FIG. 1.

Turning now to FIG. 5, a flow chart is provided to illustrate a process 500 for obtaining optimal or desirable Z-shimming parameter configuration before each scanning session from calibration data. To calibrate the Z-shim compensation gradients, the process 500 begins at process block 502, where an imaging pulse sequence is performed to acquire data to reconstruct pairs of, for example 16, images of each 2D slice. In particular, such data are acquired across the full range of possible Z-shim values, in a first and second $k_z$ frame. This data may be considered calibration image data. Images from the first $k_z$ frame may be acquired at $k_z=0$, while images from the second $k_z$ frame may be acquired with varying $k_z$ in, for example, equidistant steps. The steps may, for example, extend from −0.4 G·ms/cm to 0.4 G·ms/cm.

At process block 504, the Z-shimmed images with varying $k_z$ are then reconstructed from the second $k_z$ frame for each slice and subsequently may be combined to form a composite calibration image. The composite image may be a maximum-intensity-projection (MIP) across all calibration images for each slice, and may be regarded as the best compensation result achievable using the Z-shim method. Thus, the composite image may serve as a "gold standard" that may then, as will be described, be used in the configuration procedure for compensation.

At process block 506, a configuration sorting is performed, where a combination of any two Z-shimmed images for each slice, identifying a doublet $\{k_{z1}$ and $k_{Z2}\}$, is compared with the gold standard image to determine a best Z-shim doublet $\{k_{z1}*$ and $k_{z2}*\}$. For example at process block 506, the comparison with the gold standard image may be performed by indexing by a distance measure in the unit of percentage to reflect the compensation quality of the doublet. The best Z-shim doublet represents the two gradients that produce a composite image with the least difference from the gold standard.

After determining the desired/optimized combination for each slice, at process block 508, Z-shim parameters are selected, whereby amplitudes of the compensation gradients are used for a single-shot interleaved Z-shim EPI pulse sequence by adjusting the time integrals $A_1$ 404 and $A_2$ 406. At this point, other steps may be taken, such as ensuring a cohesive 3-D sampling by reducing potential slice intensity inhomogeneity.

Extra consideration may be used to determine a smoothed transition in the selected Z-shim gradient doublet $\{kz1*$ and $kz2*\}$ from slice to slice, to ensure a cohesive 3-D sampling as a whole, via reducing potential slice intensity inhomogeneity. The desired composite image reconstruction approach may be employed in both the Z-shimming parameter configuration and on-line or off-line image reconstruction algorithm. The industry standard is the square root of the sum of the squared images in real space after the images have been reconstructed from the k-space (2-D spatial frequency space) raw MRI data. Although this standard may be approximately adequate for configuration purposes, refinements may be desired for on-line or off-line image reconstruction.

Figure 6:
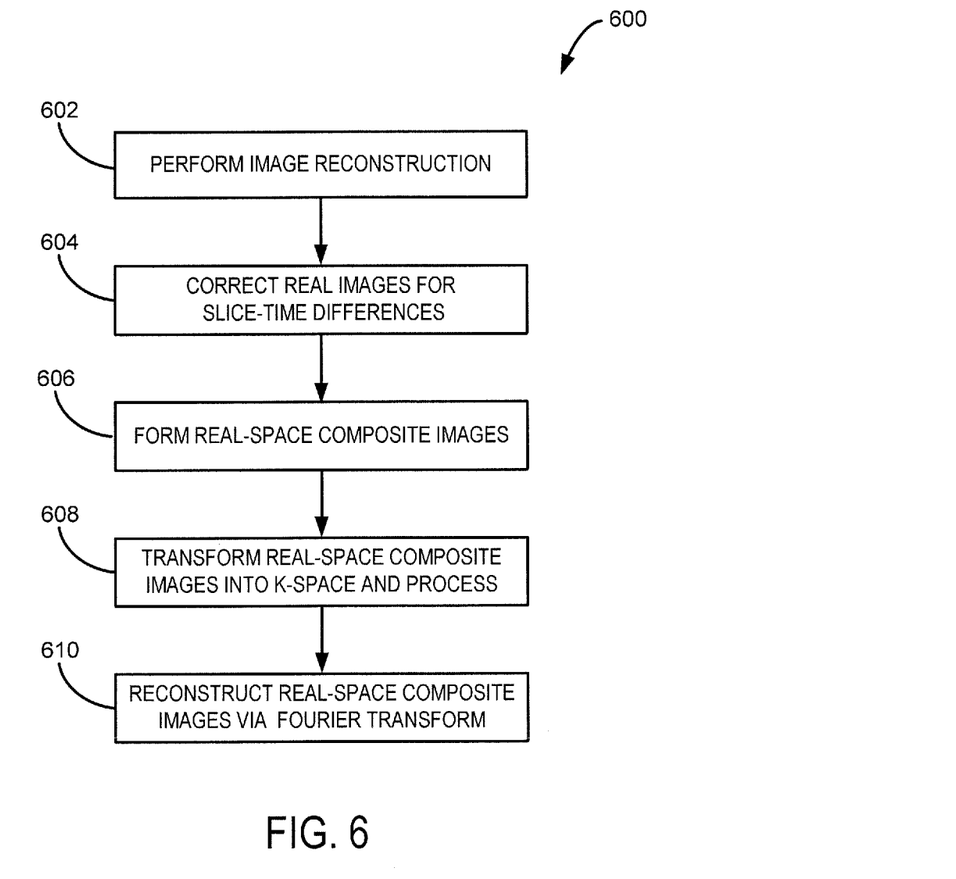
FIG. 6 is a flow chart setting forth the steps of a method for generating images in accordance with the present disclosure using an MRI system such as illustrated in FIG. 1

Turning now to FIG. 6, a flow chart is provided to illustrate a process 600 for composite image reconstruction in accordance with the present invention. In some implementations, image reconstruction may be implemented after each scan. Beginning with process block 602, images acquired using a second pulse sequence based on the z-shimming determined, for example, using the process described with respect to FIG. 5, may be first reconstructed to real space without spatial filtering of k-space, via, for example, a spatial Fourier transformation. These images may be referred to as clinical images. Then, at process block 604, using, for example, a two-shot Z-shimmed acquisition protocol, the real space images may be corrected for slice-time differences in real space, via, for example, a temporal linear interpolation based on voxel-wise triplet of previous, current, and subsequent time points.

At process block 606 a real space composite image may be generated by combining every two consecutive images acquired with the slice-wise optimal Z-shim gradient doublet $\{k_{z1}*$ and $k_{z2}*\}$ via a, for example, MIP method. The real-space composite clinical images may then be transferred back into k-space at process block 608, and subsequently filtered using, for example, a Hanning window, to repress the k-space noise in the peripheral areas remote from the origin point in the 2-D k-space. Finally, at process block 610, final real space composite images may be reconstructed via spatial Fourier transform.

The process 600 allows for Z-shimmed images to be temporally slice-timing-wise aligned, whereby the temporal properties in 4-D BOLD time series are preserved with minimal assumptions, while spatial noise from k-space sampling is reduced.

The above-described systems and methods are particularly advantageous in certain clinical applications, such fMRI studies. In one study, fMRI images were reconstructed using an approach described above with respect to FIG. 4. In particular, static GRAPPA reconstruction coefficients were generated from the two opposite polarity $k_z=0$ images acquired in the Z-shim calibration data. The reverse polarity data ensured ghost-free calibration data via PLACE. Each slice of data in the fMRI experiment was then separated according to readout polarity, either (+RO) for data acquired on positive readout gradients or (+RO) for data acquired on negative readout gradients. Separating the data in the manner induces an effective 2× acceleration. When the raw fMRI data acquisition is also accelerated using parallel imaging at a data reduction rate of 2, the subsequent single-shot images are effectively sampled at a 4× data acceleration rate. This high acceleration rate benefits from very-high quality GRAPPA calibration data. Only uniform sub-sampling in the accelerated imaging experiments was used. Nonuniform sub-sampling was not employed as the artifacts in the slices needing Z-shim compensation tended to be greater. In addition, no temporal encoding was used, and the GRAPPA reconstruction coefficients were static throughout the experiment.

In this exemplary study, fMRI data was acquired from 8 healthy volunteers using (1) no Z-shim compensation, and both (2) a double-shot and (3) a single-shot Z-shim compensation sequence. The order of the acquisition sequences was pseudo-randomized across the volunteers. Data was collected under IRB oversight, on a Siemens Tim Trio 3T (VB17) utilizing a standard 12-channel head coil. Z-shim calibration data was acquired prior to the function imaging scans, with no parallel acceleration. All subsequent functional scans were acquired using 2× acceleration. The imaging protocol defined 21 slices (5 mm thick, 1 mm gap) with a matrix size of 64×64, covering a 24 cm$^2$ FOV. The sequence imaging parameters for these data sets were:

| Sequence Variant | TR | TE | ETL | Effective echo spacing |
|---|---|---|---|---|
| No Z-shim | 1.09 s | 28 ms | 32 | 275 μs |
| Double-shot (2nex) | 109 s | 28 ms | 32 | 275 μs |
| Single-shot (1nex) | 1.12 s | 27 ms | 32 | 345 μs |

The subjects were presented with an imaging task designed to elicit an emotional response in the fronto-limbic region of the brain. The paradigm presented six blocks in pseudo-random order: images from the Sep. 11, 2001 attack on the World Trade Center; images from the US-Vietnam war (late 1960's—early 1970's); neutral images from city, suburban, and country-side scenes; and visually scrambled images from each of the prior five sets.

Analysis of the fMRI images was performed using a customized version of SPM running on a UNIX workstation (Sun Microsystems, Mountainview, Calif.). Data was realigned to correct for slight head motion based on intracranial voxels, stereotactically normalized to a standardized coordinate space (Montreal MRI Atlas version of Talairach space), and spatially smoothed with an isotropic Gaussian kernel (FWHM=7.5 mm).

A two-level voxel-wise linear random-effects model was employed to examine the effect sizes of the key condition contrasts in an ANCOVA setting. First, a voxel-wise multiple linear regression model was employed at the individual subject level. This is comprised of the regressor of interest, which consists of the stimulus onset times convolved with a prototypical hemodynamic response function, and the covariates of no interest, which consist of the temporal first-order derivative of the principal regressors (to compensate for slight latency differences in individual hemodynamic response from the prototypical response function), global fluctuations, realignment parameters, and their higher-order effects. Temporal filtering was performed to counter the effects of baseline shifts and higher frequency noise (than prototypical hemodynamic response), and an AR(1) model of the time course was used to accommodate temporal correlation in consecutive scans. Effects at every brain voxel were estimated using the EM (expectation maximization) algorithm, and regionally specific effects were then compared using linear contrasts which are entered into the group-level analysis. Second, at the group level, a random-effects model was used to estimate the within-group effect sizes of these linear contrasts, with demographic variables (age and gender) incorporated as covariates of no interest. These group-level effect estimates generate statistical maps of the t-statistic, and the statistical significance of the t-maps is then evaluated at a voxel-wise p-value thresholded at 0.05 for illustration of the activated brain regions.

Standard EPI images with no Z-shim compensation, when compared to the composite images generated by the double-shot (2nex,center) and single-shot (1nex,right) Z-shim sequences, elicited a notable difference that both Z-shim sequences effectively recover the signal loss visible in the uncompensated images, particularly in the region above the nasal sinuses. Image quality of the 2nex and 1nex images was comparable, although SNR may have been lower in the 1nex as it is formed from one-half the raw data of the 2nex image.

The 2nex data showed significant activation in the fronto-limbic region, and particularly the regions of interest indicated on the middle slice: the OFC (expected deactivation as indicated by negative Z-scores), hippocampus (expected activation), and amygdala (expected activation). These regions were notably absent or diminished in the data without Z-shim compensation, corresponding to the signal loss in these same regions. Activated voxels in these regions of interest were still identified in the 1nex sequence, although the number of activated/deactivated voxels was significantly smaller and the corresponding peak Z-score was lower than the standard set by the 2nex sequence. Numerical summary results follows, where again the 1nex sequence presents higher numbers of activated/deactivated voxels and recovers the signal lost in the no-Z-shim data. Specifically, the following provides information regarding the volume of activated voxels (mm$^3$)/peak Z-scores in frontal-limbic circuit regions:

| Sequence | Amygdala | Anterior Hippocampal/ Parahippocampal | posterior mOFC |
|---|---|---|---|
| 2nex | 783(L)/3.28 | 297(L)/2.83 | 297/−2.31 |
|  | 486(R)/2.89 | 891(R)/2.89 |  |
| 1nex | 405(L)/2.68 | 243(L)/2.41 | 81/−1.76 |
|  | 81(R)/2.00 | 432(R)/2.73 |  |
| None | 0(L)/<1.65 | 594(L)/2.20 | 0/no stats due to signal loss |
|  | 189(R)/2.25 | 648(R)/2.74 |  |

Therefore, a system and method is provided for Z-shim compensation that can acquire a complete, composite image in a single shot. The above-described pulse sequence can be particularly beneficial in scenarios where patient head motion during the course of an fMRI experiment is problematic. Accelerated 1nex Z-shim benefits from an effective acceleration rate of 4× for the reconstructed images. The use of GESTE in the calibration stage and a 12-channel head coil for acquisition was sufficient to generate static images that were free of artifacts.

Interleaved Z-gradient compensation has the advantage of acquiring two Z-shimmed images at almost the same echo time and similar signal phase evolution. This ensures that both contributions to the final image will have the same contrast and similar geometric distortion. Temporal and spatial encoding is employed to improve the clinical applicability of an interleaved single shot method, where the combination of temporal and spatial encoding is beneficial in EPI Nyquist ghost correction.

The primary goal of introducing parallel MR imaging (pMRI) to interleaved single-shot Z-shim is to reduce the echo train length (ETL), and thus reduce geometric distortion and other magnetic susceptibility artifacts. In interleaved single-shot Z-shim EPI, a Z-shim setting, Z1 or Z2, is associated with a particular readout gradient polarity, either positive or negative. Separating the positive readout data from the negative readout data introduces a natural 2× sub-sampling, which limits the overall acceleration rate one can achieve. The present invention illustrates the effectiveness of single-shot interleaved Z-shim combined with parallel imaging at 1× and 1.6× acceleration rates. This implies effective accelerations of 2× and 3.2× at the parallel imaging reconstruction stage.

The present invention has been described in terms of one or more preferred embodiments, and it should be appreciated that many equivalents, alternatives, variations, and modifications, aside from those expressly stated, are possible and within the scope of the invention.

As used in the claims, the phrase "at least one of A, B, and C" means at least one of A, at least one of B, and/or at least one of C, or any one of A, B, or C or combination of A, B, or C. A, B, and C are elements of a list, and A, B, and C may be anything contained in the Specification.

The invention claimed is:

1. A method for compensating for magnetic susceptibility variations within a subject to be imaged using a magnetic resonance imaging (MRI) system, the method including steps comprising:
   a) performing, with the MRI system, a first pulse sequence to select desired shimming parameters, the pulse sequence comprising:
      i) an imaging pulse sequence including gradient blips along two orthogonal gradient directions to acquire calibration image data from a plurality of slices across the subject;
      ii) a plurality of shimming gradient blips applied along a third gradient direction orthogonal to the two orthogonal gradient directions, wherein the shimming gradient blips are coincident in time with the gradient blips along two orthogonal gradient directions and are varied within each of the plurality of slices;
   b) reconstructing a plurality of calibration images from the calibration image data;
   c) forming a comparison image by selecting an image from plurality of calibration images corresponding to at least one of the varied shimming gradient blips for each slice and combing the selected images into the comparison image;
   d) comparing the plurality of calibration images to the comparison image to determine a value of the shimming gradient blips to be included in the desired shimming parameters;
   e) performing, with the MRI system, a second pulse sequence using the value of the shimming gradient blips included in the desired shimming parameters to acquire clinical image data from the subject;
   f) reconstructing the clinical image data to form a first set of clinical images of the subject; and
   g) selectively combining the clinical images to form a plurality of clinical composite images of the subject.

2. The method of claim 1 further comprising h) applying a spatial filter to control noise at high spatial frequencies.

3. The method of claim 2 wherein the spatial filter includes using a Hanning window to control noise at the high spatial frequencies.

4. The method of claim 2 wherein step h) includes applying an inverse-reconstruction to transfer the clinical composite images of the subject to k-space.

5. The method of claim 4 wherein step h) includes applying the spatial filter to control noise at high spatial frequencies in k-space to generate filtered image data and reconstructing the filtered image data to generate a final set of the plurality of clinical composite images of the subject.

6. The method of claim 1 wherein step g) includes combining every two consecutive images within the first set of clinical images to form the plurality of clinical composite images of the subject.

7. The method of claim 1 wherein step g) includes performing a maximum intensity projection (MIP) to combine every two consecutive images within the first set of clinical images to form the plurality of clinical composite images of the subject.

8. The method of claim 1 further comprising correcting for slice-time differences in real space.

9. The method of claim 8 wherein correcting for slice-time differences in real space includes applying a temporal linear interpolation based on a voxel-wise triplet of previous, current, and subsequent time points.

10. The method of claim 1 further comprising combining the calibration images to form the plurality of clinical composite images of the subject.

11. The method of claim 10 wherein step c) includes selecting from the plurality of clinical composite images of the subject to form the comparison image.

12. The method of claim 1 wherein step d) includes determining the value of the shimming gradient blips to control slice intensity inhomogeneities.

13. The method of claim 1 wherein the plurality of clinical composite images of the subject form functional magnetic resonance images (fMRI) of the subject.

14. A magnetic resonance imaging (MRI) system, comprising:
   a magnet system configured to generate a polarizing magnetic field about at least a portion of a subject arranged in the MRI system;
   a magnetic gradient system including a plurality of magnetic gradient coils configured to apply at least one magnetic gradient field to the polarizing magnetic field;
   a radio frequency (RF) system configured to apply an RF field to the subject and to receive magnetic resonance signals therefrom;
   a computer system programmed to:
      a) control the gradient system and the RF system to perform a first pulse sequence to select desired Z-shimming parameters, the pulse sequence comprising:
         i) an imaging pulse sequence including gradient blips along an x-direction and a y-direction to acquire calibration image data from a plurality of slices across the subject;
         ii) a plurality of Z-shimming gradient blips along Z-direction, wherein the Z-shimming gradient blips are coincident in time with the gradient blips along the x-direction and the y-direction and are varied within each of the plurality of slices;
      b) reconstruct a plurality of calibration images form the calibration image data;
      c) select a comparison image;
      d) compare the plurality of calibration images to the comparison image to determine a value of the Z-shimming gradient blips that provided calibration images approximate to the comparison image;
      e) control the gradient system and the RF system to perform a second pulse sequence using the value of the Z-shimming gradient blips included in the desired Z-shimming parameters to acquire clinical image data from the subject;

f) reconstruct the clinical image data to form a first set of clinical images of the subject; and g) selectively combine the clinical images to form a plurality of clinical composite images of the subject by combining consecutive images acquired with a given Z-shimming gradient doublet indicated by the desired Z-shimming parameters.

15. The system of claim 14 wherein the computer system is further programmed to utilize a maximum intensity projection algorithm to selectively combining the clinical images to form the plurality of clinical composite images.

16. The system of claim 14 wherein the computer system is further programmed to transform the plurality of clinical composite images to k-space as a plurality of clinical composite image data sets, filter the plurality of clinical composite image data sets to remove noise in high spatial frequencies, and reconstruct a final plurality of clinical composite images from the filtered plurality of clinical composite image data sets.

17. The system of claim 14 wherein the computer system is further programmed to track a stimulus of the subject during the second pulse sequence and correlating the stimulus with the plurality of clinical composite images of the subject.

18. The system of claim 14 wherein the computer system is further programmed to correct for slice-time differences in real space by applying a temporal linear interpolation based on a voxel-wise triplet of previous, current, and subsequent time points.

19. The system of claim 14 wherein the computer system is further programmed to determine the value of the Z-shimming gradient blips to control slice intensity inhomogeneities in step d).

20. The system of claim 14 wherein the first pulse sequence and the second pulse sequence include a gradient echo, echo planar imaging (GE-EPI) pulse sequence.

* * * * *